US008502585B2

(12) United States Patent
Kuenemund et al.

(10) Patent No.: US 8,502,585 B2
(45) Date of Patent: Aug. 6, 2013

(54) DEVICE WITH A DATA RETENTION MODE AND A DATA PROCESSING MODE

(75) Inventors: Thomas Kuenemund, Munich (DE); Anton Huber, Taufkirchen (DE); Roswitha Deppe, Munich (DE)

(73) Assignee: Infineon Technologies AG, Neubiberg (DE)

( * ) Notice: Subject to any disclaimer, the term of this patent is extended or adjusted under 35 U.S.C. 154(b) by 48 days.

(21) Appl. No.: 13/187,772

(22) Filed: Jul. 21, 2011

(65) Prior Publication Data
US 2013/0021076 A1 Jan. 24, 2013

(51) Int. Cl.
*H03K 3/356* (2006.01)

(52) U.S. Cl.
USPC .......................................... 327/208

(58) Field of Classification Search
USPC .................. 327/199–203, 208, 210–212, 214, 327/215, 218
See application file for complete search history.

(56) References Cited

U.S. PATENT DOCUMENTS

| 7,180,348 | B2 | 2/2007 | Frederick et al. |
| 7,183,825 | B2 | 2/2007 | Padhye et al. |
| 7,391,250 | B1 * | 6/2008 | Chuang ......................... 327/211 |
| 7,639,056 | B2 | 12/2009 | Gururajarao et al. |
| 2007/0103217 | A1 | 5/2007 | Frederick, Jr. et al. |
| 2008/0303573 | A1 | 12/2008 | Hsieh et al. |
| 2009/0033394 | A1 | 2/2009 | Frederick, Jr. et al. |
| 2009/0058485 | A1 | 3/2009 | Berzins et al. |

* cited by examiner

*Primary Examiner* — Lincoln Donovan
*Assistant Examiner* — Sibin Chen
(74) *Attorney, Agent, or Firm* — Murphy, Bilak & Homiller, PLLC

(57) ABSTRACT

A device includes a flip flop and a control circuit. The flip flop includes a flip flop data input terminal and a flip flop clock input terminal. The control circuit includes a control circuit data input terminal and a control circuit clock input terminal. The control circuit is configured to route, in a Data Processing Mode of the device, an incoming data signal from the control circuit data input terminal to the flip flop data input terminal and an incoming clock signal from the control circuit clock input terminal to the flip flop clock input terminal and to apply, in a Data Retention Mode of the device, a first given fixed signal value to the flip flop data input terminal independent of a value of the incoming data signal and a second given fixed signal value to the flip flop clock input terminal independent of a value of the incoming clock signal.

19 Claims, 8 Drawing Sheets

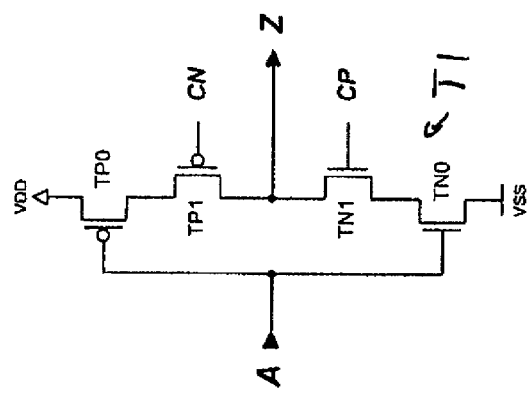
Tristate Inverter
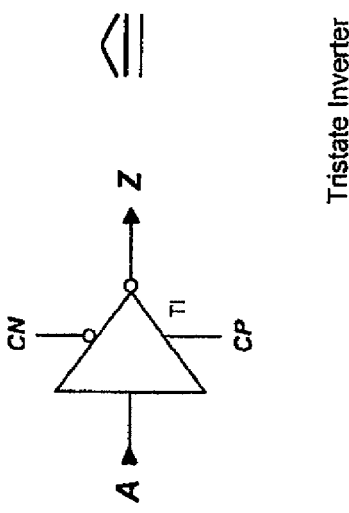
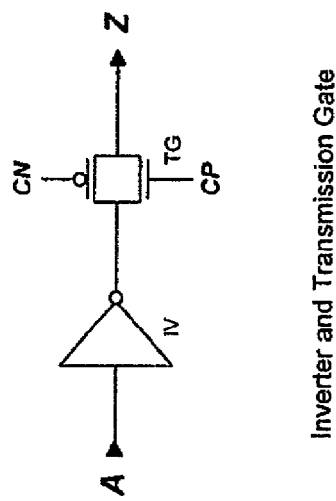
Inverter and Transmission Gate
Fig. 6

800

802

Routing, in a Data Processing Mode of the device, an incoming data signal from a control circuit data input terminal of the control circuit to a flip flop data input terminal of the flip flop and an incoming clock signal from a control circuit clock input terminal of the control circuit to a flip flop clock input terminal of the flip flop.

804

Applying, in a Data Retention Mode of the device, a first given fixed signal value to the flip flop data input terminal of the flip flop independent of a value of the incoming data signal and a second given fixed signal value to the flip flop clock input terminal of the flip flop independent of a value of the incoming clock signal.

Fig. 8

DEVICE WITH A DATA RETENTION MODE AND A DATA PROCESSING MODE

TECHNICAL FIELD

The present application relates to a device including a flip flop and having a Data Retention Mode and a Data Processing Mode and a method for such a device.

BACKGROUND

Registers based on flip flops are used in a variety of circuits for storing states. For reducing the current consumption of such a circuit, such circuit may comprise a Data Processing Mode in which the circuit performs its desired function. Furthermore, such devices or circuits may comprise a so-called Data Retention Mode or sleep or stand-by mode, in which the data processing of the device is interrupted. In the Data Retention Mode typically only a low static leakage current should be allowed. Furthermore, it is desired to ensure that after changing from the Data Retention Mode to the Data Processing Mode the device (e.g. the IC-integrated circuit) can immediately continue with the data processing. Furthermore, for a flip flop used in such a device the state stored in the flip flop should be preserved even in the Data Retention Mode.

Known concepts transfer data contents of registers to other storage circuits, for example, integrated register files or SRAM (static random access memory) of the IC before changing from the Data Processing Mode to the Data Retention Mode. These other storage circuits remain connected to the supply voltage in the Data Retention Mode. When resuming the Data Processing Mode these data contents are transferred back into the associated register. This concept has the disadvantage of additional circuitry and a significant increase in time and complexity.

Other concepts provide special Data Retention flip flops which comprise one additional low leakage latch (LLL) per bit to be saved. The stored information in the flip flop is transferred to this low leakage latch before entering the Data Retention Mode and is transferred back to the flip flop before resuming the Data Processing Mode. This enables, in the Data Retention Mode, the decoupling of the flip flop from the supply voltage, wherein the LLL is left coupled to the supply voltage. It can be achieved that the LLL consumes only small leakage current. This is possible because the LLL does not have to comply with any performance requirements. This concept has the disadvantage of a significant area and cost increase for the implementation of the low leakage latch.

SUMMARY

Embodiments described herein provide a device including a flip flop and a control circuit. The flip flop includes a flip flop data input terminal and a flip flop clock input terminal. The control circuit includes a control circuit data input terminal and a control circuit clock input terminal. The control circuit is configured to route, in a Data Processing Mode of the device, an incoming data signal from a control circuit data input terminal to the flip flop data input terminal and an incoming clock signal from the control circuit clock input terminal to the flip flop clock input terminal and to apply, in a data retention mode of the device, a first given fixed signal value to the flip flop data input terminal independent of a value of the incoming data signal and a second given fixed signal value to the flip flop clock input terminal independent of a value of the incoming clock signal.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 6 shows an implementation of the combination of an inverter and a transmission gate as a tristate inverter.

FIG. 8 shows a flow diagram of a method according to an embodiment.

DETAILED DESCRIPTION

Figure 1:
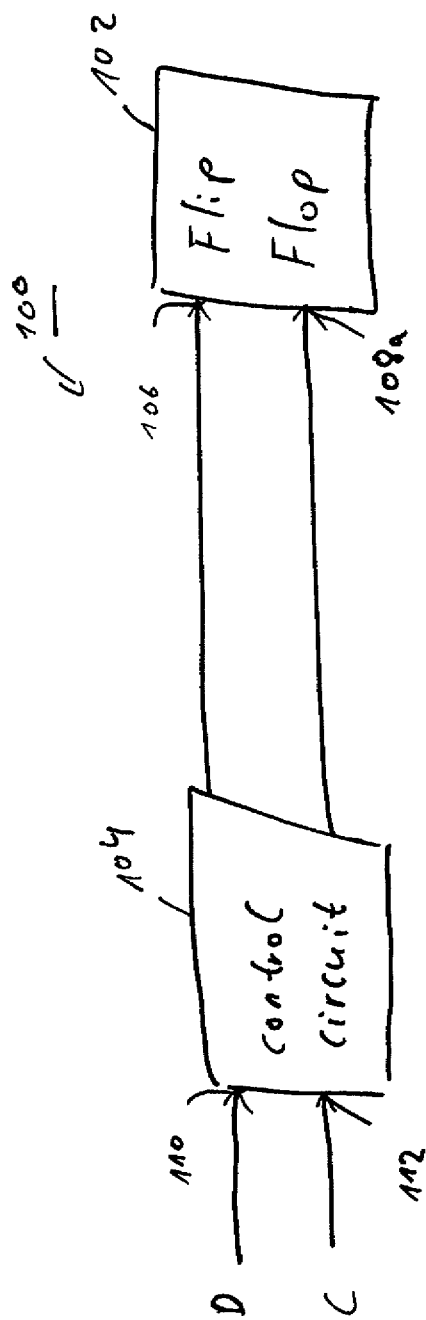
FIG. 1 shows a block schematic diagram of a device according to an embodiment.

FIG. 1 shows a block schematic diagram of a device 100 (or register 100) according to an embodiment. The device 100 includes a flip flop 102 and a control circuit 104. The flip flop 102 includes a flip flop data input terminal 106 and a flip flop clock input terminal 108a. The control circuit 104 includes a control circuit data input terminal 110 and a control circuit clock input terminal 112. The control circuit 104 is configured to route, in a Data Processing Mode of the device 100, an incoming data signal D from its control circuit data input terminal 110 to the flip flop data input terminal 106 and an incoming clock signal C from its control circuit clock input terminal 112 to the flip flop clock input terminal 108a and to, in a Data Retention Mode of the device 100, apply a first given fixed signal value to the flip flop data input terminal 106 independent of a value of the incoming data signal D. Furthermore, the control circuit 104 is configured to apply, in the Data Retention Mode of the device 100, a second given fixed signal value to the flip flop clock input terminal 108a independent of the value of the incoming clock signal C.

According to some embodiments, the first given fixed signal value may be equal to the second given fixed signal value.

The term 'route' as used herein means that a routed signal can be inverted or non-inverted. In other words, the control circuit 104 may provide the incoming data signal D at the flip flop 102, in the Data Processing Mode, in an inverted version or a non-inverted version.

Also, the meaning of 'coupling' is in the sense of a direct low impedance coupling and an indirect coupling with one or more elements in-between, such that a signal at a second node is dependent on a signal at a first node which is coupled to the second node. In other words, further elements, especially switching elements (like transistors) or drivers, may be placed between two coupled elements. Between two coupled elements an additional element may placed, but not necessarily, therefore two coupled elements may be directly connected (using a low impedance connection, like a wire or a trace or a conductor path).

Furthermore, the control circuit 104 may provide the incoming clock signal C at the flip flop clock input terminal 108a, in the Data Processing Mode, in an inverted version or a non-inverted version. In other words, in the Data Processing Mode of the device 100 the signal value at the flip flop data input terminal 106 is based on a value of the incoming data signal D at the control circuit data input terminal 110 and a value at the flip flop clock input terminal 108a is dependent on a value of the incoming clock signal C at the control circuit clock input terminal 112.

By applying, in the Data Retention Mode of the device 100, fixed values to the input terminals 106, 108a of the flip flop 102 it can be achieved that driving circuits (or drivers) for the data signal D and the clock signal C can be deactivated in the Data Retention Mode without generating undesired leakage currents in the flip flop 102.

By deactivating the driver circuits for the data signal D and the clock signal C these signals may assume undefined values, which, in conventional approaches, would lead to the above mentioned undesired leakage currents in the flip flop 102 during the Data Retention Mode.

But by applying the first given fixed signal value to the flip flop data input terminal 106 and the second given fixed signal value to the flip flop clock input terminal 108a, in the Data Retention Mode, no undesired leakage currents are generated in the flip flop 102 of the device 100. To summarize, the device 100 enables a Data Retention Mode in which no leakage current is generated in the flip flop 102 due to undefined values of the incoming data signal D and the incoming clock signal C.

Therefore, clock trees and combinatorial data path logic outside the flip flop 102 may be fully deactivated in the Data Retention Mode. Due to the fact that these clock trees and data path logic are mainly built of fast logic gates which consume a high leakage current, the deactivation of these logic gates results in a significant leakage current reduction.

Figure 2:
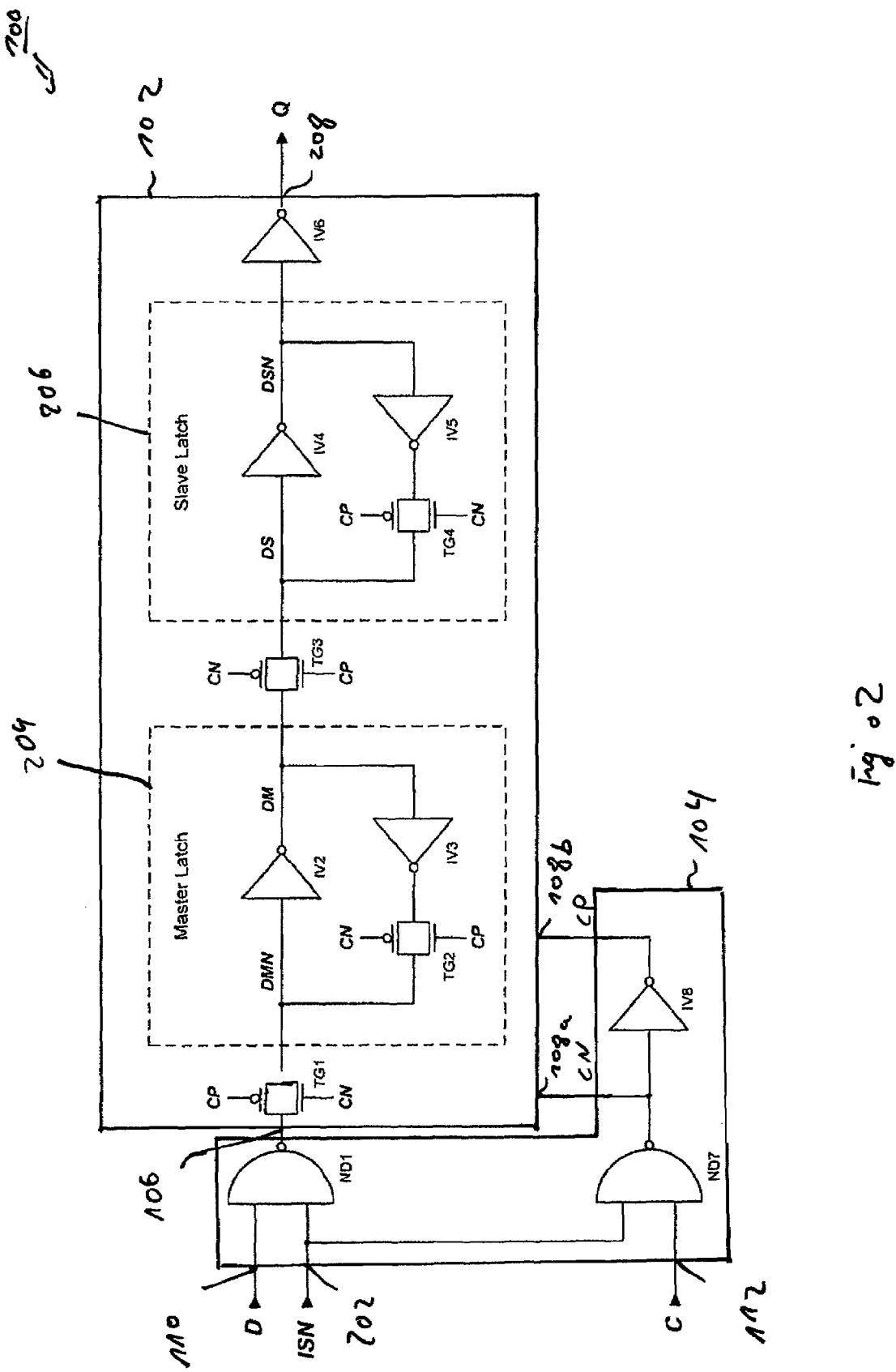
FIG. 2 shows a schematic diagram of a device according to a further embodiment.

FIG. 2 shows a schematic for a possible implementation of the device 100 in FIG. 1. The control circuit 104 includes a first NAND gate ND1, a second NAND gate ND7 and a first inverter IV8.

Furthermore, the control circuit 104 includes a mode selection signal input terminal 202 for receiving an isolation signal ISN (or a mode selection signal ISN).

According to some embodiments, the mode selection signal ISN may be controlled by the control circuit 104 (e.g. comprising further elements) or by a further element of the device 100 connected to the mode selection signal input terminal 202.

A first input terminal of the first NAND gate ND1 is coupled to the control circuit data input terminal 110 and a second input terminal of the first NAND gate ND1 is coupled to the mode selection signal input terminal 202. An output of the first NAND gate ND1 is coupled to the flip flop data input terminal 106 of the flip flop 102. A first input of the second NAND gate ND7 is coupled to the mode selection signal input terminal 202 and a second input terminal of the second NAND gate ND7 is coupled to the control circuit clock input terminal 112. An output terminal of the second NAND gate ND7 is coupled to an input terminal of the first inverter IV8. Furthermore, the output terminal of the second NAND gate ND7 is coupled to a first flip flop clock input terminal 108a of the flip flop 102. An output of the first inverter IV8 is coupled to a second flip flop clock input terminal 108b of the flip flop 102.

The flip flop 102 includes the flip flop data input terminal 106, the first flip flop clock input terminal 108a and the second flip flop clock input terminal 108b. Furthermore, the flip flop 102 includes a master latch 204 and a slave latch 206. Furthermore, the flip flop 100 includes a first transmission gate TG1. The first transmission gate TG1 is coupled between the flip flop data input terminal 106 and an input terminal or input node DMN of the master latch 204. An inverted clock terminal of the first transmission gate TG1 is coupled to the second flip flop clock input terminal 108b and a non-inverted clock input terminal of the first transmission gate TG1 is coupled to the first flip flop clock input terminal 108a.

Furthermore, the flip flop 102 includes a second transmission gate TG3. The second transmission gate TG3 is coupled between an output terminal or output node DM of the master latch 204 and an input terminal or input node DS of the slave latch 206. An inverted clock input terminal of the second transmission gate TG3 is coupled to the first flip flop clock input terminal 108a and a non-inverted clock input terminal of the second transmission gate TG3 is coupled to the second flip flop clock input terminal 108b.

Furthermore, the flip flop 102 includes a second inverter IV6. An input terminal of the second inverter IV6 is coupled to an output terminal or output node DSN of the slave latch 106. An output terminal of the second inverter IV6 is coupled to a flip flop data output terminal 208 of the flip flop 102.

In the embodiment shown in FIG. 2 the master latch 204 includes a third inverter IV2 coupled between the input node DMN and the output node DM of the master latch 204. Furthermore, the master latch 204 includes a fourth inverter IV3 and a third transmission gate TG2. An input terminal of the fourth inverter IV3 is coupled to the node DM of the master latch 204. The transmission gate TG2 is coupled between an output terminal of the fourth inverter IV3 and the input node DMN of the master latch 204.

An inverted clock input terminal of the third transmission gate TG2 is coupled to the first flip flop clock input terminal 108a and a non-inverted clock input terminal of the third transmission gate TG2 is coupled to the second flip flop clock input terminal 108b.

The slave latch 206 includes a fifth inverter IV4 coupled between the input node DS and the node output DSN of the slave latch 206. Furthermore, the slave latch 206 includes a sixth inverter IV5 and a fourth transmission gate TG4. An input terminal of the sixth inverter IV5 is coupled to the output node DSN of the slave latch 206. The fourth transmission gate TG4 is coupled between an output terminal of the sixth inverter IV5 and the input node DS of the slave latch 206. An inverted clock input terminal of the fourth transmission gate TG4 is coupled to the second flip flop clock input terminal 108b and a non-inverted clock input terminal of the fourth transmission gate TG4 is coupled to the first flip flop clock input terminal 108a.

In the following, the functionality of the device 100 is described. The device 100 includes as storage elements the master latch 204 and the slave latch 206. During the Data Processing Mode, with a rising edge of the clock signal C, a current data bit at the control circuit data input terminal 110 is stored in the master latch 204 (with C=1 and therefore CN=0, CP=1). Hence, the first transmission gate TG1 is in a non-conductive state, and isolates the flip flop data input terminal 106 from the master latch nodes DMN and DM, while, due to the conductive third transmission gate TG2 the feedback inside the master latch 204 is activated. The data bit stored in the master latch 204 is routed to the flip flop data output terminal 208 through the transparent slave latch 206 because of C=1 (the second transmission gate TG3 is conductive).

Vice versa, with a falling edge of the clock signal C, i.e. C=0, the slave latch 206 is isolated from the master latch 204 (the second transmission gate TG3 is in a non-conductive state) and the data bit from the master latch 204 is stored in the slave latch 206 (TG4 conductive, which means the feedback in the slave latch 206 is active). Furthermore, a value at the flip flop data input terminal 106 is routed, due to the conductive first transmission gate TG1, to the master latch nodes DMN and DM. Furthermore, before entering the stand-by or Data Retention Mode of the device 100 the clock C is stopped, which means in current IC implementations that the flip flop clock input terminals are held at C=0 (e.g. CN=1, CP=0).

Values at these clock input terminals may includes rising edges or values C=1 (CN=0, CP=1) only after switching back to the Data Processing Mode. This means that immediately before entering the Data Retention Mode, for all registers (or flip flops) because of C=0, the slave latch 206 is isolated from the master latch 204 (TG3 not conductive) and the slave latch 206 stores the data (or state) from the master latch 206 (TG4 conductive), while, due to the conductive first transmission gate TG1, the value at the flip flop data input terminal 106 is not isolated from the master latch node DMN and DM. In conventional registers not having the control circuit 104 coupled to the flip flop data input terminal, when decoupling the logic gate supplying the incoming data signal D from the supply voltage in the Data Retention Mode the flip flop data input terminal would take (at least for some time) undefined values, which would lead to leakage current in the gates IV2 and IV3 of such conventional registers.

In the device 100 this problem is solved by introducing the additional control signal ISN and further transistor functions for isolating the incoming data signal D and the incoming clock signal C. In the following, a detailed functionality of the control circuit 104 in conjunction with the flip flop 102 is described.

For ISN=1 the functionality of the register shown in FIG. 2 may be identical to a conventional register not having the control circuit 104, as for ISN1=1 the NAND gates ND1 and ND7 behave like normal inverters. But for ISN=0, the internal values CN and CP of the clock C are held, independent of the value of the clock signal C, by the second NAND gate ND7 and the first inverter IV8, at CN=1 and CP=0. In other words, the slave latch 206 remains isolated from the master latch 204 as for C=0.

Furthermore, due to the first NAND gate ND1, the conductive first transmission gate TG1, and the third inverter IV2, the node DMN is set to 1 and the node DM is set to 0, hence, the values of DMN and DM are independent of the value at the control circuit data input terminal 110. In other words, the node 110 is with ISN=0 isolated, such that the value of the data signal D has no influence on the current through the data input interface (or the flip flop data input terminal 106) of the register. Thus, with a constant value of 0 for ISN during the complete Data Retention Mode, the device 100 allows the clock tree for the clock signal C and the (combinatorial) logic gates for providing the data signal D to be decoupled from the supply voltage for minimizing the leakage current without losing the information stored in the slave latch 206 of the flip flop 102.

To summarize, in the Data Processing Mode of the device 100 ISN=1 holds and the NAND gates ND1, ND7 behave like inverters for the incoming data signal D and the incoming clock signal C. But in the Data Retention Mode, i.e. for ISN=0, the flip flop data input terminal 106 is set to the first fixed value (logical 1), the first flip flop clock input terminal 108a is set to the second fixed value (logical 1, CN=1) and the second flip flop clock input terminal 108b is set to another fixed value (logical 0, CP=0), independent of the value of the data signal D and the value of the clock signal C. By having CP=0 and CN=1, the first transmission gate TG1 is conductive and therefore the master latch 204 holds the logical value 1. Furthermore, the slave latch 206 is isolated from the master latch 204 by the non-conductive state of the second transmission gate TG3. Furthermore, the information stored in the slave latch 206 from the Data Processing Mode is preserved in the slave latch 206 due to the conductive state of the fourth transmission gate TG4.

Hence, it can be seen that in the Data Retention Mode the state of the master latch 204 and the slave latch 206 are independent of the values of the incoming data signals D and the incoming clock signals C. Therefore, drivers for the data signal D and the clock signal C may be deactivated in the Data Retention Mode for reducing the current consumption of the device 100. In other words, the device 100 may be configured to deactivate, in the Data Retention Mode of the device 100, a first driver for driving the data signal D and a second driver for driving the clock signal C.

Furthermore, the device 100 may be configured to maintain, in the Data Retention Mode of the device 100, a supply voltage for the master latch 204 and the slave latch 206, such that in the Data Retention Mode, the master latch 204 and the slave latch 206 are active. By maintaining the supply voltage at the master latch 204 and the slave latch 206, it can be achieved that when switching back from the Data Retention Mode to the Data Processing Mode the value stored in the slave latch 206 is still valid and, furthermore, the master latch 204 has a defined state.

Therefore, no additional feedback loop from the slave latch 206 to the master latch 204 is necessary, which otherwise would consume additional area on a chip of the device 100 and additional current. In other words, the device 100 is feedback-free outside the master latch 204 and the slave latch 206 (such that a state of the master latch 204 is, in the Data Processing Mode and the Data Retention Mode, independent of a state in the slave latch 206).

Although, in the example in FIG. 2, the control circuit 104 is configured to combine the incoming data signal D with the mode selection signal ISN using the first NAND gate ND1 and to combine the clock signal C with the mode selection signal ISN using the second NAND gate ND7 according to further embodiments, other logical combinations may be used too (for example, NOR gates). In general, the control circuit 104 may be configured to (logically) combine the mode selection signal ISN with the incoming clock signal C and the incoming data signal D.

Furthermore, the control circuit 104 may be configured to provide, in the Data Processing Mode and the Data Retention Mode, a result of the combination of the mode selection signal ISN with the incoming clock signal C to the first flip flop clock input terminal 108a (and the inverted result to the second flip flop clock input terminal 108b). Furthermore, the control circuit 104 may be configured to provide a result of the combination of the mode selection signal ISN with the incoming data signal D to the flip flop data input terminal 106.

As mentioned before, a first signal value of the mode selection signal ISN (ISN=1) may correspond to the Data Processing Mode and a second signal value of the mode selection signal ISN (ISN=0) may correspond to the Data Retention Mode. The control circuit 104 may be configured to combine the mode selection signal ISN with the incoming clock signal C such that for the first signal value of the mode selection signal ISN (ISN=1, corresponding to the Data Processing Mode) the result of the combination of the mode selection signal ISN and the incoming data signal D follows (in an inverted or non-inverted version) the incoming data signal D and the result of the combination of the mode selection signal ISN and the incoming clock signal C follows (in an inverted or non-inverted version) the incoming clock signal C.

Furthermore, the control circuit 104 may be configured such that for the second signal value of the mode selection signal ISN (ISN=0, corresponding to the Data Retention Mode) the result of the combination of the mode selection signal ISN and the incoming data signal D is the first signal value (for example, being inverted to the second signal value of the mode selection signal ISN) and the result of the combination of the mode selection signal ISN and the incoming clock signal C is the second given fixed value (for example, being equal to the first given fixed value) independent of the state of the incoming clock signal C and state of the incoming data signal D.

According to further embodiments, as mentioned before, the device 100 may be configured to ensure, in the Data Processing Mode and directly before switching into the Data Retention Mode, a signal value (e.g. C=0) of the clock signal C leading at the flip flop clock input terminal 108a to a signal value (CN=1) equal to the second given fixed signal value (CN=1), such that, when switching from the Data Processing Mode to the Data Retention Mode the signal at the first flip flop clock terminal 108a (and the signal at the second flip flop clock terminal 108b) remain(s) constant.

In the embodiment shown in FIG. 2, directly before switching into the Data Retention Mode (corresponding to ISN=0) the incoming clock signal C has a value leading to CN=1 and CP=0 and as in this state the device 100 is changed from the Data Processing Mode to the Data Retention Mode, i.e. ISN is changed from 1 to 0, the states of CN and CP remain constant, i.e. no further edge is applied to the flip flop clock input terminals 108a, 108b.

As mentioned before, in the Data Retention Mode of the device 100 the master latch 204 is isolated from the slave latch 206. This is achieved by having the second transmission gate TG3 coupled to the first flip flop clock input terminal 108a and the second flip flop clock input terminal 108b, such that for the second given fixed value applied by the control circuit 100 to the first flip flop clock input terminal 108a (CN=1) and the inverted version thereof applied to the second flip flop clock input terminal 108b (CP=0), the second transmission gate TG3 is in a high impedance state and isolates the master latch 204 from the slave latch 206.

Figure 3:
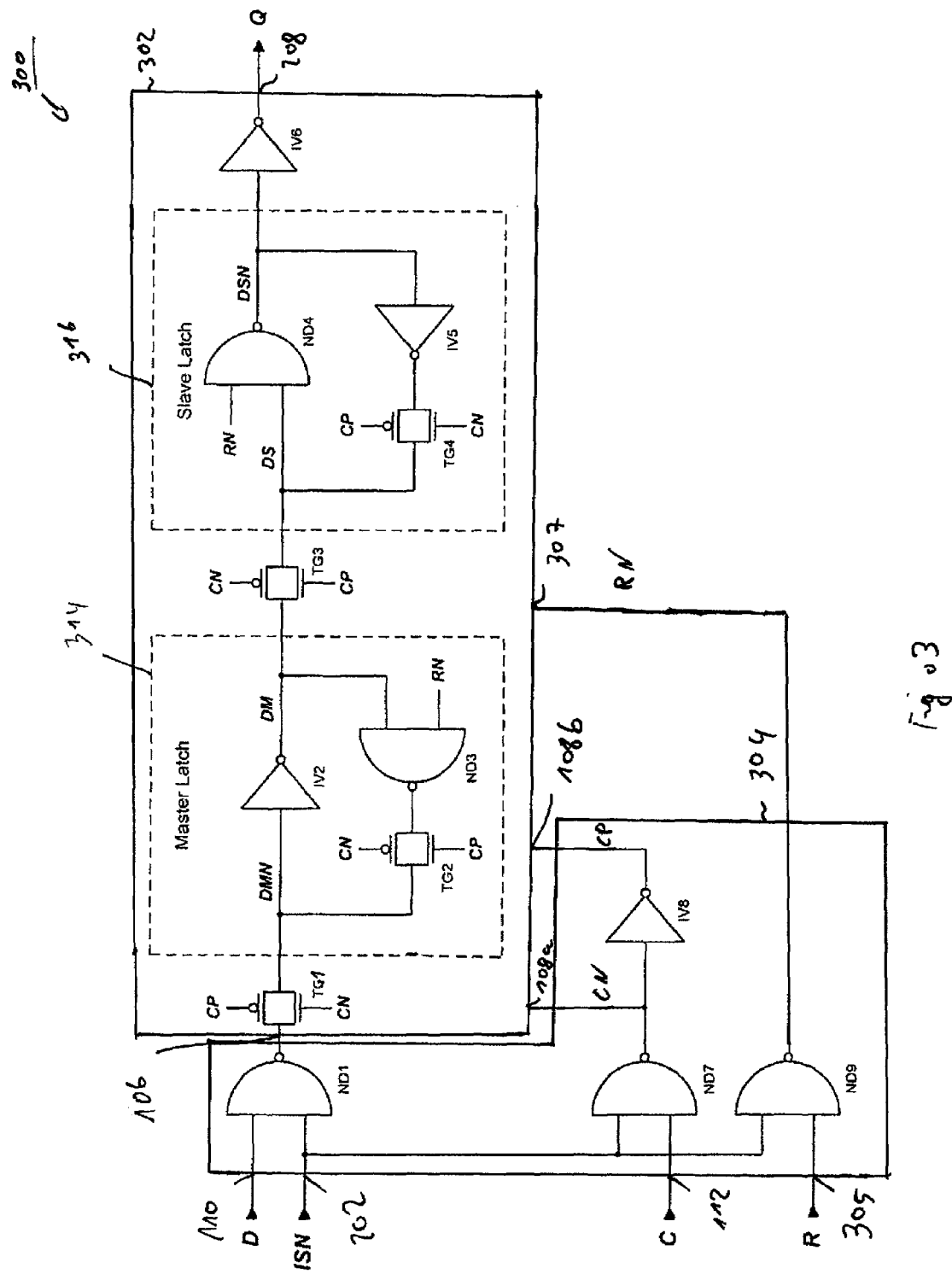
FIG. 3 shows a schematic diagram of a device according to a further embodiment.

FIG. 3 shows a device 300 according to a further embodiment. The device 300 extends the device 100 shown in FIG. 2 and additionally has a reset function. The device 300 includes a control circuit 304 and a flip flop 302. The control circuit 304 differs from the control circuit 104 shown in FIG. 2 in that it additionally includes a third NAND gate ND9. A first input terminal of the third NAND gate ND9 is coupled to the mode selection input terminal 202 of the control circuit 304. A second input terminal of the third NAND gate ND9 is coupled to a reset input terminal 305 of the control circuit 304 for receiving a reset signal R. An output terminal of the third NAND gate ND9 is coupled to a flip flop reset input terminal 307.

Furthermore, the flip flop 302 differs from the flip flop 102, in that it offers a reset functionality by having the additional reset input terminal 307 and by including a master latch 314 and a slave latch 316 with each offering a reset functionality. The master latch 314 differs from the master latch 204 in that the fourth inverter IV3 is replaced by a fourth NAND gate ND3. A first input terminal of the fourth NAND gate ND3 is coupled to the node DM and a second input terminal of the fourth NAND gate ND3 is coupled to the reset input terminal 307 of the flip flop 302. An output terminal of the fourth NAND gate ND3 is coupled to the third transmission gate TG2.

Furthermore, the slave latch 316 differs from the slave latch 206 in that the fifth inverter IV4 is replaced by a fifth NAND gate ND4. A first input terminal of the fifth NAND gate ND4 is coupled to the reset input terminal 307, a second input terminal of the fifth NAND gate ND4 is coupled to the node DS of the slave latch 316 and an output terminal of the fifth NAND gate ND4 is coupled to the node DSN of the slave latch 316.

The control circuit 304 is configured to route, in the Data Processing Mode of the device 300, the incoming reset signal R from its control circuit reset input terminal 305 to the flip flop reset input terminal 307. As can be seen in FIG. 3, the control circuit 304 routes the incoming reset signal R in an inverted version RN to the flip flop reset input terminal 307. Furthermore, the control circuit 304 is configured to apply, in the Data Retention Mode of the device 300 (when ISN=0), a third given fixed signal value to the reset input terminal 307 (e.g. RN=1) independent of a value of the reset signal R.

To summarize, FIG. 3 shows a possible generalization of the device 100 shown in FIG. 2. The device 300 or the register 300 includes the additional reset input terminal 305, an activation of which leads to an asynchronous flip flop output terminal 208, which means the flip flop output terminal 208 is set to 0 independent of the clock signal C (in the Data Processing Mode).

It can be assumed that immediately before changing to the Data Retention Mode the reset signal R is inactive (i.e. R=0 for the case shown in FIG. 3), because otherwise the IC (comprising the device 300) or at least parts of it would be in a reset state, in which the data contents of the slave latch 316 would be set to zero. Activating the Data Retention Mode (i.e. setting ISN to 0) leads to RN=1, independent of the current value of the reset signal R. Hence, parts of the circuit providing the reset signal R can be decoupled from the supply voltage in the Data Retention Mode, without losing the information stored in the slave latch 316 of the device or the register 300.

The embodiment shown in FIG. 3 of combining the different input signals for the flip flop 302 with the mode selection signal ISN can be extended to further functional extensions of the flip flop 302, (for example flip flop versions exhibiting enable signals or scan signals).

Figure 4:
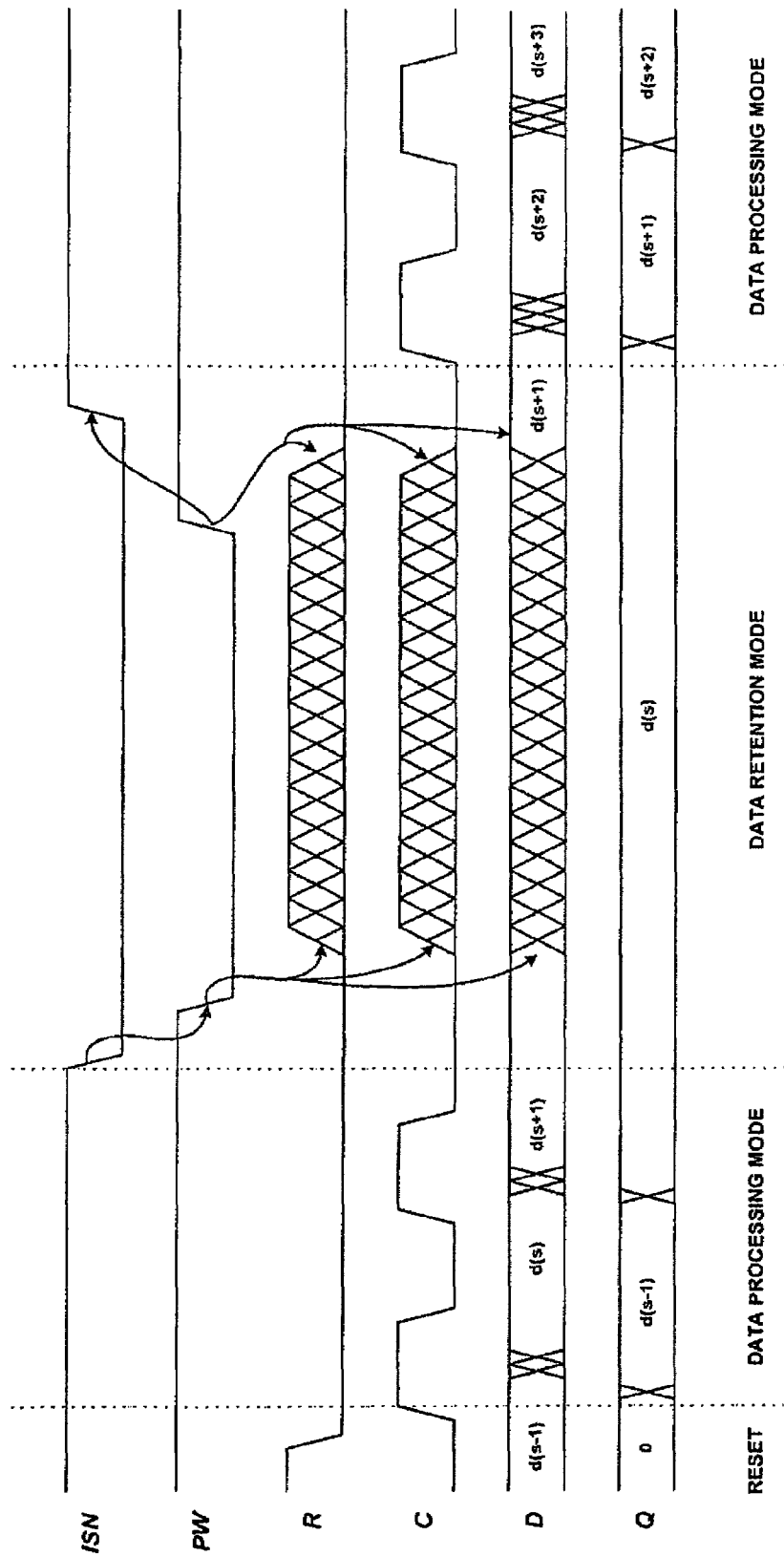
FIG. 4 shows a timing diagram for switching between a Data Processing Mode and a Data Retention Mode of the device of FIG. 3.

In the following, the timing behavior of the device 300 shown in FIG. 3 is described in detail using FIG. 4.

An IC may typically include a plurality of such devices or registers 300. Therefore, in the following it is assumed that an IC has a plurality of the devices 300 all of which can be operated in a Data Processing Mode or a Data Retention Mode by switching on a system level the signal PW and the mode selection signal ISN.

Before entering the Data Retention Mode the clock inputs 112 (and therefore the clock signal C) of all affected registers (or devices) are set to zero. Furthermore, it is assumed that the reset signal R is inactive immediately before entering the Data Retention Mode (i.e. R=0 for the case shown in FIG. 3).

Hence, every involved register can be isolated from its input interfaces without losing the information stored in the register, as long as the register is supplied with a supply voltage and the internal values RN, CN and CP of the reset and the clock signal keep their values constant. The latter is achieved by activating the signal ISN on the system level, i.e., with a falling edge of ISN (and the constant value of 0 for ISN for the complete Data Retention Mode). This leads to RN=1, CN=1 and CP=0, thereby ensuring that the slave latch 316 cannot change into the reset state. Therefore the slave latch 316 preserves the stored date.

Subsequently to the falling edge of ISN, every circuit part of the IC which is not needed in the Data Retention Mode can be decoupled from the supply voltage. This may be performed by deactivating the signal PW on the system level, i.e. with a falling edge of PW and the constant value of 0 for PW throughout the entire Data Retention Mode. As a result of this, all input signals of the registers (except ISN, but D, C and R in FIG. 3) can take on undefined values without leading to a malfunction of the device 300 or the IC including the device 300.

For switching back to the Data Processing Mode, the signal PW is activated on system level, i.e. a rising edge of PW is triggered. Hence, all parts of the IC including the device 300, which have been decoupled from the supply voltage during the Data Retention Mode, are coupled again to the supply voltage. The result of this is that the data input 110 of the registers or devices take the values which they had before (immediately before leaving the Data Processing Mode).

The reason for this is that the values at the input terminal 110 of a given flip flop result from a Boolean combination of register output values Q from other flip flops realized with certain combinational gates.

All register output values Q still have their old values (because it was assumed that all relevant registers are not decoupled from the supply voltage). After assuming constant values D the isolation of the registers can be switched off, since now the control circuit clock input terminal 112 and the control circuit reset input terminal 305 have taken their old values (both have a value of zero) which they had immediately before leaving the Data Processing Mode. Now, all registers and the whole IC (including the device 300) are functional again.

To summarize, the edge triggered register 300 shown in FIG. 3 with the isolatable input interfaces and the data preserving has the following advantages. Combinatorial data paths as well as clock and reset trees outside the register 300 can be fully (or at least partially) deactivated in the Data Retention Mode. Since these data paths, clock trees and reset trees consist mainly of fast switching logic gates, these gates consume a lot of leakage current. Hence, deactivating these circuits means a significant leakage current reduction. Furthermore, the few drivers for ISN (and PW) do not necessarily need to be fast or strong, such that these drivers only need a small resulting leakage current (during the Data Retention Mode). Furthermore, as the state of the master latches 204, 314 during the Data Retention Mode is always known (DMN=1 and DM=0) the transistors for the master latches 204, 314 (for example, in the inverters IV2, IV3, the transmission gate TG2 and/or the NAND gate ND3) can be optimized regarding the leakage current for this state in the Data Retention Mode. In the embodiments shown in FIGS. 2 and 3 the transistors of the master latch 314 may be optimized, such that for DMN=1 and DM=0, the leakage current is reduced compared to the other case for DMN=0 and DM=1. In other words, transistors of the master latches 204, 314 may be configured such that for the state of the master latches 204, 314 in the Data Retention Mode, a current consumption is equal to or lower than for a further state of the master latches 204, 314 in the Data Processing Mode.

Figure 5:
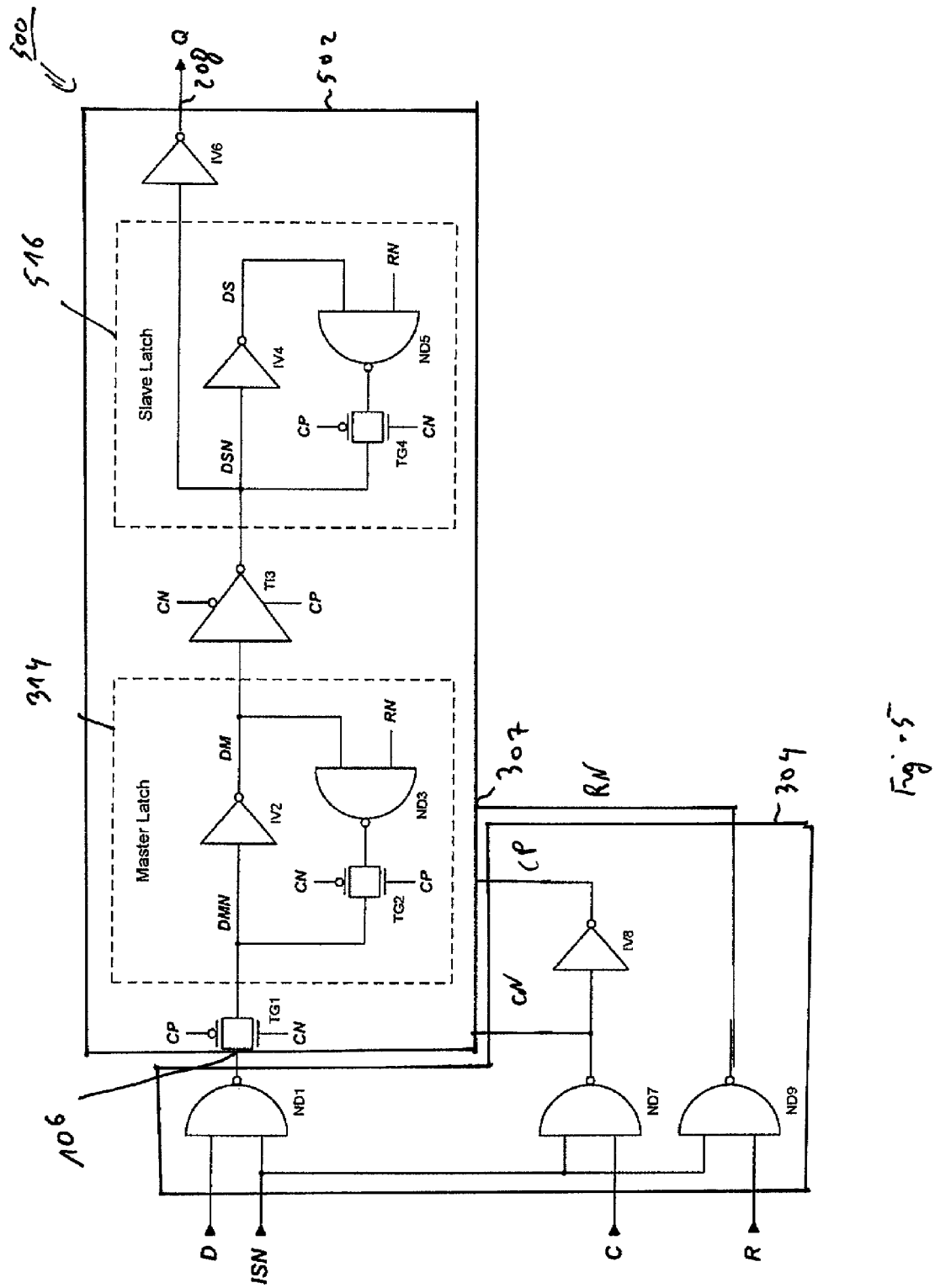
FIG. 5 shows a schematic diagram of a device according to a further embodiment.

FIG. 5 shows a schematic view of a device 500 according to a further embodiment. The device 500 is an alternative implementation to the device 300, i.e. its functionality is the same. The device 500 differs from the device 300 in that a flip flop 502 of the device 500 is slightly different from the flip flop 302 of the device 300. The flip flop 502 differs in that the second transmission gate TG3 is replaced by a so-called tristate inverter T13. Furthermore, a slave latch 516 of the flip flop 502 differs from the slave latch 206 shown in FIG. 2 in that the sixth inverter IV5 is replaced by a sixth NAND gate ND5. A first input terminal of the sixth NAND gate ND5 is coupled to the output terminal of the fifth inverter IV4, a second input terminal of the sixth NAND gate ND5 is coupled to the flip flop reset input terminal 307 and an output terminal of the sixth NAND gate ND5 is coupled to the fourth transmission gate TG4. Furthermore, in the slave latch 516 the nodes DS and DSN are exchanged, as the tristate inverter TI3 already provides an inversion. Therefore, the input terminal of the second inverter IV6 of the device 500 is coupled to the input of the fifth inverter IV4 and not, as it was the case in the device 100 shown in FIG. 2, to the output of the fifth inverter IV4. In other words, FIG. 5 shows an alternative solution for a Data Retention flip flop with reset to the Data Retention flip flop with reset as shown in FIG. 3.

FIG. 6 shows how a combination of an inverter IV and a transmission gate TG can be implemented as a tristate inverter TI. The tristate inverter TI includes a series connection of a first p-channel transistor TP0, a second p-channel transistor TP1, a second n-channel transistor TN1 and a first n-channel transistor TN0. A gate terminal of the first p-channel transistor TP0 forms an inverted input terminal of the tristate inverter TI and a gate terminal of the first n-channel transistor TN0 forms a non-inverted input terminal of the tristate inverter TN0. The inverted input terminal and the non-inverted input terminal of the tristate inverter TI are connected to a common input terminal A of the tristate inverter TI. A gate terminal of the second p-channel transistor TP1 forms an inverted clock input of the tristate inverter TI, and a gate terminal of the second n-channel transistor TN1 forms a non-inverted clock input of the tristate inverter TI. A drain terminal of the second p-channel transistor TP1 is connected to a drain terminal of the second n-channel transistor TN1 and to a common output terminal Z of the tristate inverter TI.

Figure 7:
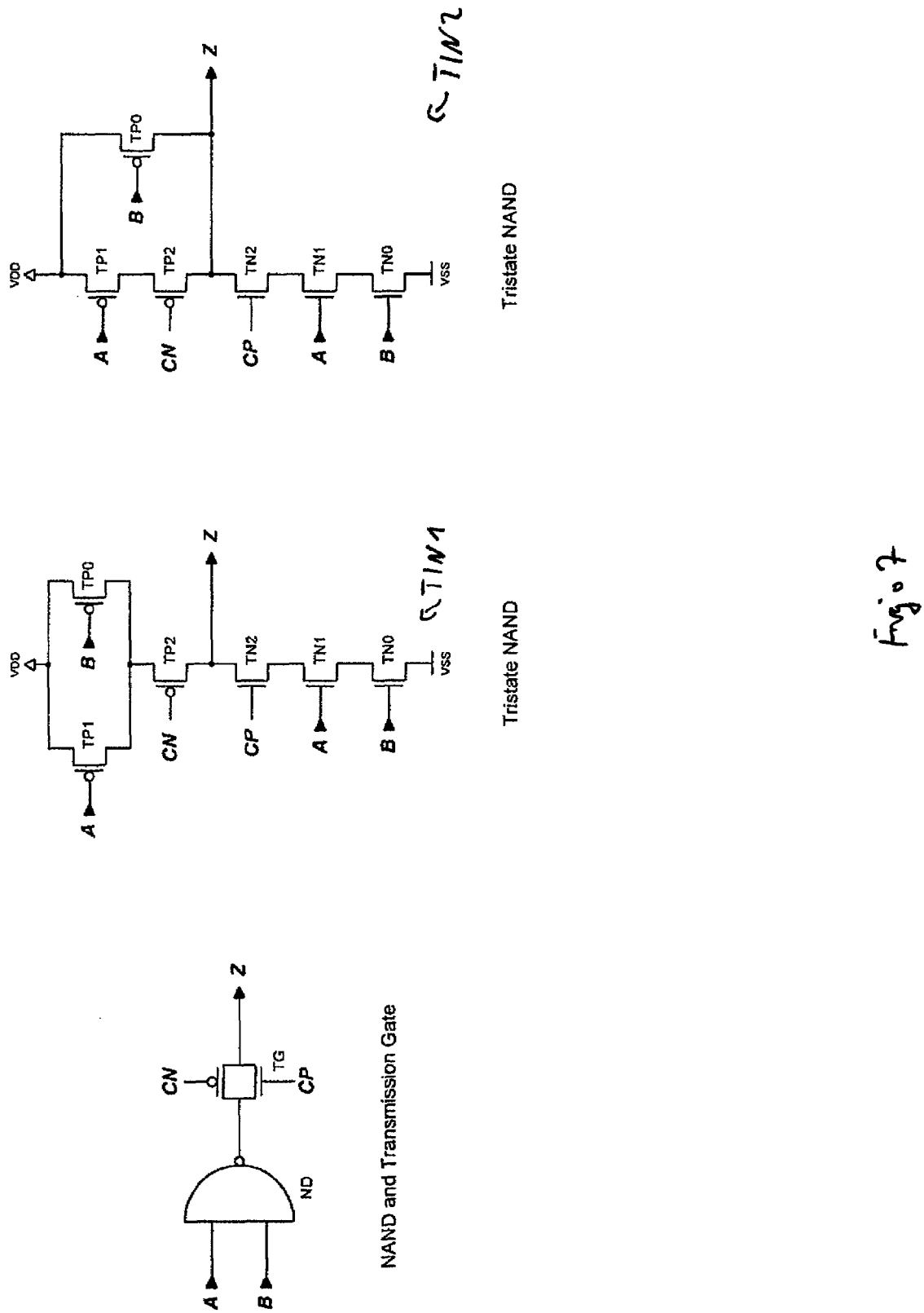
FIG. 7 shows implementations of the combination of a NAND gate and a transmission gate as tristate NANDs.

Furthermore, FIG. 7 shows how a combination of a NAND gate ND and a transmission gate TG can be implemented with a first tristate NAND TIN1 or a second tristate NAND TIN2. The first tristate NAND gate TIN1 includes a parallel connection of a first p-channel transistor TP0 and a second p-channel transistor TP1. A gate terminal of the second p-channel transistor TP1 is connected to a first input terminal A of the first tristate NAND TIN1. A gate terminal of the first p-channel transistor TP0 is connected to a second input terminal B of the first tristate NAND TIN1. Furthermore, the first tristate NAND TIN1 includes a series connection of a first n-channel transistor TN0, a second n-channel transistor TN1, a third n-channel transistor TN2 and a third p-channel transistor TP2. This series connection is in series with the parallel connection of the first p-channel transistor TP0 and the second p-channel transistor TP1.

A gate terminal of the first n-channel transistor TN0 is connected to the second input terminal B, a gate terminal of the second n-channel transistor TN1 is connected to the first input terminal A. A gate terminal of the third n-channel transistor TN2 forms a non-inverted clock input terminal of the first tristate NAND TIN1. A gate terminal of the third p-channel transistor TP2 forms an inverted clock input terminal of the first tristate NAND TIN1. A drain terminal of the third n-channel transistor TN2 and a drain terminal of the third p-channel transistor TP2 are connected to a common output terminal Z of the first tristate NAND TIN1.

The second tristate NAND TIN2 differs from the first tristate NAND TIN1 in that, the first p-channel transistor TP0 is in parallel to the second p-channel transistor TP1 and the third p-channel transistor TP2. Hence, a drain terminal of the third of the first p-channel transistor TP0 is also connected to the common output terminal Z of the tristate NAND TIN2.

Hence, further embodiments of the present invention can be achieved by implementing the combination of an inverter and a transmission gate as a tristate inverter and the combination of a NAND gate and a transmission gate as a tristate NAND (for example, in the devices 100, 300, 500).

According to further embodiments, and as already mentioned before, the outputs of the NAND gates ND7 and ND9 (signals CN, CP and RN) can be used for a plurality of flip flops of a register. In other words, a device according to an embodiment may include a plurality of flip flops, in which the clock input terminal of the flip flops are all coupled to one and the same terminal of a control circuit of the device at which the control circuit provides the second fixed signal value during the Data Retention Mode and the clock signal C (in an inverted or non-inverted version) in the Data Processing Mode. The same may apply for the flip flop reset input terminals.

In other words, some of the circuits inside the registers which are coupled to the mode selection signal ISN (ND7 and ND9) are reusable in multi-bit registers, and therefore are needed only once, although the register is built for example, for four bits.

To summarize, the embodiments described herein provide an edge triggered register (flip flop) with an isolatable input interface (for example isolatable data, clock and reset input) and a data retention for an integrated semiconductor circuit with a Data Retention Mode or a sleep or stand-by mode, with which a normal mode (Data Processing Mode) can be interrupted. In the Data Retention Mode only a very small static leakage current is consumed from the IC.

Furthermore, according to an embodiment an IC is capable to immediately continue the Data Processing after changing from the Data Retention Mode to the Data Processing Mode.

Furthermore, devices or registers according to embodiments described herein with isolatable input interface can be implemented with little effort in an already existing development cycle and in the implementation for the ICs. This is especially applicable for the relevant timing behavior of the interface signals of the registers during the changes between the Data Processing Mode and the Data Retention Mode.

In embodiments large parts of switching nets and switching circuits (from the combinatorial or sequential logic) can be decoupled from the supply voltage (for example, either from the positive supply potential VDD or from the supply ground VSS) by means of a high impedance switching. In embodiments at least a part of the switching registers remains coupled to the supply voltage for retaining the information stored in these registers. In other words, a significant number of registers stay connected to the supply voltage, even in the Data Retention Mode. Therefore, these registers (for example, registers 100, 300, 500) can be isolated from the part of the IC, which are decoupled from the supply voltage, which would otherwise lead to undesired and non-controllable leakage currents or transfer currents through the input interfaces of the registers.

Furthermore, for the changes from the Data Processing Mode to the Data Retention Mode, the clock signal (for example, the clock signal C and the reset R) have the Boolean value 0 immediately before changing into the Data Retention Mode and immediately after continuing the Data Processing Mode. In other words, the clock signals can be physically connected to the lower supply potential VSS immediately before changing to the Data Retention Mode and immediately after continuing the Data Processing Mode.

FIG. 8 shows a flow diagram of a method 800 for a device including a flip flop and a control circuit according to a further embodiment. The method 800 includes a step 802 of routing, in a Data Processing Mode of the device, an incoming data signal from a control circuit data input terminal of the control circuit to a flip flop data input terminal of the flip flop and an incoming clock signal from a control circuit clock input terminal of the control circuit to a flip flop clock input terminal of the flip flop. Furthermore, the method 800 includes a step 804 of applying, in a Data Retention Mode of the device, a first given fixed signal value to the flip flop data input terminal independent of a value of the incoming data signal and a second given fixed signal value to the flip flop clock input terminal independent of a value of the incoming clock signal.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some, one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention include a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments include the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) including, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment includes a processing means, for example a computer, or a programmable logic device, configured to or adapted to perform one of the methods described herein.

A further embodiment includes a computer having installed thereon the computer program for performing one of the methods described herein.

A further embodiment includes an apparatus or a system configured to transfer (for example, electronically or optically) a computer program for performing one of the methods described herein to a receiver. The receiver may, for example, be a computer, a mobile device, a memory device or the like. The apparatus or system may, for example, include a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
a flip flop comprising a flip flop data input terminal and a flip flop clock input terminal;
a control circuit comprising a control circuit data input terminal and a control circuit clock input terminal;
wherein the control circuit is configured to route, in a Data Processing Mode of the device, an incoming data signal from the control circuit data input terminal to the flip flop data input terminal, and an incoming clock signal from the control circuit clock input terminal to the flip flop clock input terminal and to apply, in a Data Retention Mode of the device, a first given fixed signal value to the flip flop data input terminal independent of a value of the incoming data signal and a second given fixed signal value to the flip flop clock input terminal independent of a value of the incoming clock signal; and
wherein the device is configured to set, in the Data Processing Mode and directly before switching into the Data Retention Mode, the clock signal to a value leading at the flip flop clock input terminal to a signal value equal to the second given fixed signal value, such that, when switching from the Data Processing Mode to the Data Retention Mode, the signal at the flip flop clock input terminal remains constant.

2. The device according to claim 1, wherein the device is configured to deactivate, in the Data Retention Mode, a first driver for driving the data signal and a second driver for driving the clock signal.

3. The device according to claim 1, wherein the flip flop comprises a master latch and a slave latch, and the device is configured to maintain, in the Data Retention Mode, a supply voltage for the master latch and the slave latch, such that in the Data Retention Mode the master latch and the slave latch are active.

4. The device according to claim 1, wherein the flip flop comprises a master latch and a slave latch, and the device is feedback-free outside of the master latch and the slave latch.

5. The device according to claim 1, wherein the control circuit comprises a mode selection input terminal configured to receive a mode selection signal, the control circuit is configured to combine the mode selection signal with the incoming clock signal and the incoming data signal, and the control circuit is further configured to provide, in the Data Processing Mode and in the Data Retention Mode, a result of the combination of the mode selection signal with the incoming clock signal to the flip flop clock input terminal and a result of the combination of the mode selection signal with the incoming data signal to the flip flop data input terminal.

6. The device according to claim 5, wherein a first signal value of the mode selection signal corresponds to the Data Processing Mode and a second signal value of the mode selection signal corresponds to the Data Retention Mode, and the control circuit is configured to combine the mode selection signal with the incoming clock signal such that for the first signal value of the mode selection signal the result of the combination of the mode selection signal and the incoming data signal follows the incoming data signal and the result of the combination of the mode selection signal and the incoming clock signal follows the incoming clock signal, and for the second signal value of the mode selection signal the result of the combination of the mode selection signal and the incoming data signal is the first given fixed signal value independent of the state of the incoming data signal and the result of the combination of the mode selection signal and the incoming clock signal is the second given fixed value independent of the state of the incoming clock signal.

7. The device according to claim 5, wherein the control circuit is configured such that the combination of the mode selection signal and the incoming data signal comprises a first NAND operation and the combination of the mode selection signal and the incoming clock signal comprises a second NAND operation.

8. The device according to claim 1, wherein the flip flop comprises a master latch, a slave latch and a switching element between the master latch and the slave latch, and the switching element is coupled to the flip flop clock input terminal and is configured such that, for the second given fixed signal value, the switching element is in a high impedance state, such that, in the Data Retention Mode, the master latch is isolated from the slave latch.

9. The device according to claim 1, wherein the flip flop comprises a further flip flop input terminal and the control circuit comprises a further control circuit input terminal, and the control circuit is configured to route, in the Data Processing Mode, a further incoming signal from the further control circuit input terminal to the further flip flop input terminal and to apply, in the Data Retention Mode, a third given fixed signal value to the further flip flop input terminal independent of a value of the further incoming signal.

10. The device according to claim 9, wherein the further control circuit input terminal is a control circuit reset input terminal and the flip flop input terminal is a flip flop reset input terminal and the further incoming signal is a reset signal.

11. The device according to claim 9, wherein the further control circuit input terminal is a control circuit enable or scan input terminal and the further flip flop input terminal is a flip flop enable or scan input terminal and the further incoming signal is an enable or scan signal.

12. The device according to claim 1, further comprising:
a further flip flop comprising a further flip flop clock input terminal;
wherein the flip flop clock input terminal of the flip flop and the further flip flop clock input terminal of the further flip flop are coupled together to a common terminal of the control circuit, at which, in the Data Retention Mode, the control circuit is configured to provide the second given fixed signal value.

13. The device according to claim 1, wherein the flip flop comprises a master latch, a state of the master latch is constant in the Data Retention Mode, and transistors of the master latch are configured such that, for the state of the master latch in the Data Retention Mode, a current consumption of the master latch is equal or lower than for a further state of the master latch in the Data Processing Mode.

14. A device, comprising:
a means for storing a state comprising a first data input means and a first clock input means;
a means for controlling comprising a second data input means and a second clock input means;
wherein the means for controlling is configured to route, in a Data Processing Mode of the device, an incoming data signal from the second data input means to the first data input means and an incoming clock signal from the second clock input means to the first clock input means and to apply, in a Data Retention Mode of the device, a first given fixed signal value to the first data input means independent of a value of the incoming data signal and a second given fixed signal value to the first clock input means independent of a value of the incoming clock signal; and
wherein the device is configured to set, in the Data Processing Mode and directly before switching into the Data Retention Mode, the clock signal to a value leading at the flip flop clock input terminal to a signal value equal to the second given fixed signal value, such that, when switching from the Data Processing Mode to the Data Retention Mode, the signal at the flip flop clock input terminal remains constant.

15. A device, comprising:
a flip flop comprising a flip flop data input terminal, a flip flop clock input terminal, a master latch and a slave latch;
a control circuit comprising a control circuit data input terminal and a control circuit clock input terminal;
wherein the control circuit is configured to combine a mode selection signal and an incoming data signal based on a first NAND function and to provide the result of the combination of the mode selection signal and the incoming data signal to the flip flop data input terminal;
wherein the control circuit is configured to combine the mode selection signal and the incoming clock signal based on a second NAND function and to provide the result of the combination of the mode selection signal and the incoming clock signal to the flip flop clock input terminal;
wherein the device is configured to set, in a Data Processing Mode of the device, the mode selection signal to a first signal value, which is chosen such that, for the first signal value of the mode selection signal, the result of the combination of the mode selection signal and the incoming data signal is dependent on the incoming data signal and the result of the combination of the mode selection signal and the incoming clock signal is dependent on the incoming clock signal;
wherein the device is configured to set, in a Data Retention Mode of the device, the mode selection signal to a second signal value, which is chosen such that, for the second signal value of the mode selection signal, the result of the combination of the mode selection signal and the incoming data signal is a first given fixed signal value, independent of the incoming data signal and the result of the combination of the mode selection signal and the incoming clock signal is a second given fixed signal value, independent of the incoming clock signal;
wherein the device is configured to set, in the Data Processing Mode and directly before switching into the Data Retention Mode, the clock signal to a value leading at the flip flop clock input terminal to a signal value equal to the second given fixed signal value, such that, when switching from the Data Processing Mode to the Data Retention Mode, the signal value at the flip flop clock input terminal remains constant;
wherein the device is configured to deactivate, in the Data Retention Mode, a first driver configured to drive the data signal and a second driver configured to drive the clock signal;
wherein the device is configured to maintain, in the Data Retention Mode, a supply voltage for the master latch and the slave latch, such that in the Data Retention Mode the master latch and the slave latch are active; and
wherein the device is feedback-free outside of the master latch and the slave latch.

16. A method for a device comprising a flip flop and a control circuit, the method comprising:
routing, in a Data Processing Mode of the device, an incoming data signal from a control circuit data input terminal of the control circuit to a flip flop data input terminal of the flip flop and an incoming clock signal from a control circuit clock input terminal of the control circuit to a flip flop clock input terminal of the flip flop; and
applying, in a Data Retention Mode of the device, a first given fixed signal value to the flip flop data input terminal independent of a value of the incoming data signal and a second given fixed signal value to the flip flop clock input terminal independent of a value of the incoming clock signal; and
setting, in the Data Processing Mode and directly before switching into the Data Retention Mode, the clock signal to a value leading at the flip flop clock input terminal to a signal value equal to the second given fixed signal value, such that, when switching from the Data Processing Mode to the Data Retention Mode, the signal at the flip flop clock input terminal remains constant.

17. A computer readable digital storage medium having stored thereon a computer program having a program code for performing, when running on a computer, a method for a device comprising a flip flop and a control circuit, the method comprising:

routing, in a Data Processing Mode of the device, an incoming data signal from a control circuit data input terminal of the control circuit to a flip flop data input terminal of the flip flop and an incoming clock signal from a control circuit clock input terminal of the control circuit to a flip flop clock input terminal of the flip flop; and applying, in a Data Retention Mode of the device, a first given fixed signal value to the flip flop data input terminal independent of a value of the incoming data signal and a second given fixed signal value to the flip flop clock input terminal independent of a value of the incoming clock signal; and setting, in the Data Processing Mode and directly before switching into the Data Retention Mode, the clock signal to a value leading at the flip flop clock input terminal to a signal value equal to the second given fixed signal value, such that, when switching from the Data Processing Mode to the Data Retention Mode, the signal at the flip flop clock input terminal remains constant.

18. A device, comprising:

a flip flop comprising a flip flop data input terminal and a flip flop clock input terminal;

a control circuit comprising a control circuit data input terminal and a control circuit clock input terminal;

wherein the control circuit is configured to route, in a Data Processing Mode of the device, an incoming data signal from the control circuit data input terminal to the flip flop data input terminal, and an incoming clock signal from the control circuit clock input terminal to the flip flop clock input terminal and to apply, in a Data Retention Mode of the device, a first given fixed signal value to the flip flop data input terminal independent of a value of the incoming data signal and a second given fixed signal value to the flip flop clock input terminal independent of a value of the incoming clock signal; and wherein the flip flop comprises a master latch and a slave latch, and the device is feedback-free outside of the master latch and the slave latch.

19. A device, comprising:

a flip flop comprising a flip flop data input terminal and a flip flop clock input terminal;

a control circuit comprising a control circuit data input terminal and a control circuit clock input terminal;

wherein the control circuit is configured to route, in a Data Processing Mode of the device, an incoming data signal from the control circuit data input terminal to the flip flop data input terminal, and an incoming clock signal from the control circuit clock input terminal to the flip flop clock input terminal and to apply, in a Data Retention Mode of the device, a first given fixed signal value to the flip flop data input terminal independent of a value of the incoming data signal and a second given fixed signal value to the flip flop clock input terminal independent of a value of the incoming clock signal; and wherein the flip flop comprises a further flip flop input terminal and the control circuit comprises a further control circuit input terminal, and the control circuit is configured to route, in the Data Processing Mode, a further incoming signal from the further control circuit input terminal to the further flip flop input terminal and to apply, in the Data Retention Mode, a third given fixed signal value to the further flip flop input terminal independent of a value of the further incoming signal.

* * * * *